(12) United States Patent
Desplats et al.

(10) Patent No.: US 6,970,759 B2
(45) Date of Patent: Nov. 29, 2005

(54) METHOD AND DEVICE FOR AUTOMATIC OPTIMAL LOCATION OF AN OPERATION ON AN INTEGRATED CIRCUIT

(75) Inventors: Romain Desplats, Toulouse (FR); Bruno Benteo, Pompertuzat (FR)

(73) Assignee: Centre National D'Etudes Spatiales (C.N.E.S.), Paris Cedex (FR)

( * ) Notice: Subject to any disclaimer, the term of this patent is extended or adjusted under 35 U.S.C. 154(b) by 334 days.

(21) Appl. No.: 10/257,034

(22) PCT Filed: Apr. 6, 2001

(86) PCT No.: PCT/FR01/01048
§ 371 (c)(1),
(2), (4) Date: Oct. 8, 2002

(87) PCT Pub. No.: WO01/77774
PCT Pub. Date: Oct. 18, 2001

(65) Prior Publication Data
US 2003/0079187 A1 Apr. 24, 2003

(30) Foreign Application Priority Data
Apr. 11, 2000 (FR) .......................................... 00 04647

(51) Int. Cl.$^7$ .......................... G06F 17/00; H01L 21/66
(52) U.S. Cl. ............................ 700/109; 700/28; 700/95
(58) Field of Search ............................. 700/28, 90, 95, 700/109

(56) References Cited

U.S. PATENT DOCUMENTS

| | | |
|---|---|---|
| 4,706,019 A | 11/1987 | Richardson |
| 4,721,909 A | 1/1988 | Richardson |
| 5,140,164 A | 8/1992 | Talbot et al. |
| 5,392,222 A | 2/1995 | Noble |
| 5,675,499 A | 10/1997 | Lee et al. |
| 6,751,519 B1 * | 6/2004 | Satya et al. ................. 700/121 |

OTHER PUBLICATIONS

Kunich C et al.: "LayDis–and Advanced Navigation System for Electron Beam Probing", Microelectronic Engineering, NL, Elsevier Publisher BV., Amsterdam, vol. 31, No. 1, Feb. 1, 1996, pp. 355–362, XP004006647 ISSN: 0167-9317.

* cited by examiner

Primary Examiner—Jayprakash N. Gandhi
(74) Attorney, Agent, or Firm—Young & Thompson

(57) ABSTRACT

A process and installation for automatic optimal location of a servicing operation on an integrated circuit. The accessible polygons are retrieved on the basis of topographic descriptive data and data representing the electrical circuit. For each step, different execution options are determined, each corresponding to each of the different accessible polygons, and a rating is calculated and assigned to each execution option as a function of the depth of each possible initial polygon with respect to the access surface, and of accessibility parameters of each possible initial polygon, and the optimal execution option to be used for executing each step of the servicing operation is determined automatically by a numerical optimization calculation using the ratings assigned to the different execution options of each step of the servicing operation.

20 Claims, 6 Drawing Sheets

DS 1 1 1;

9 CELL;

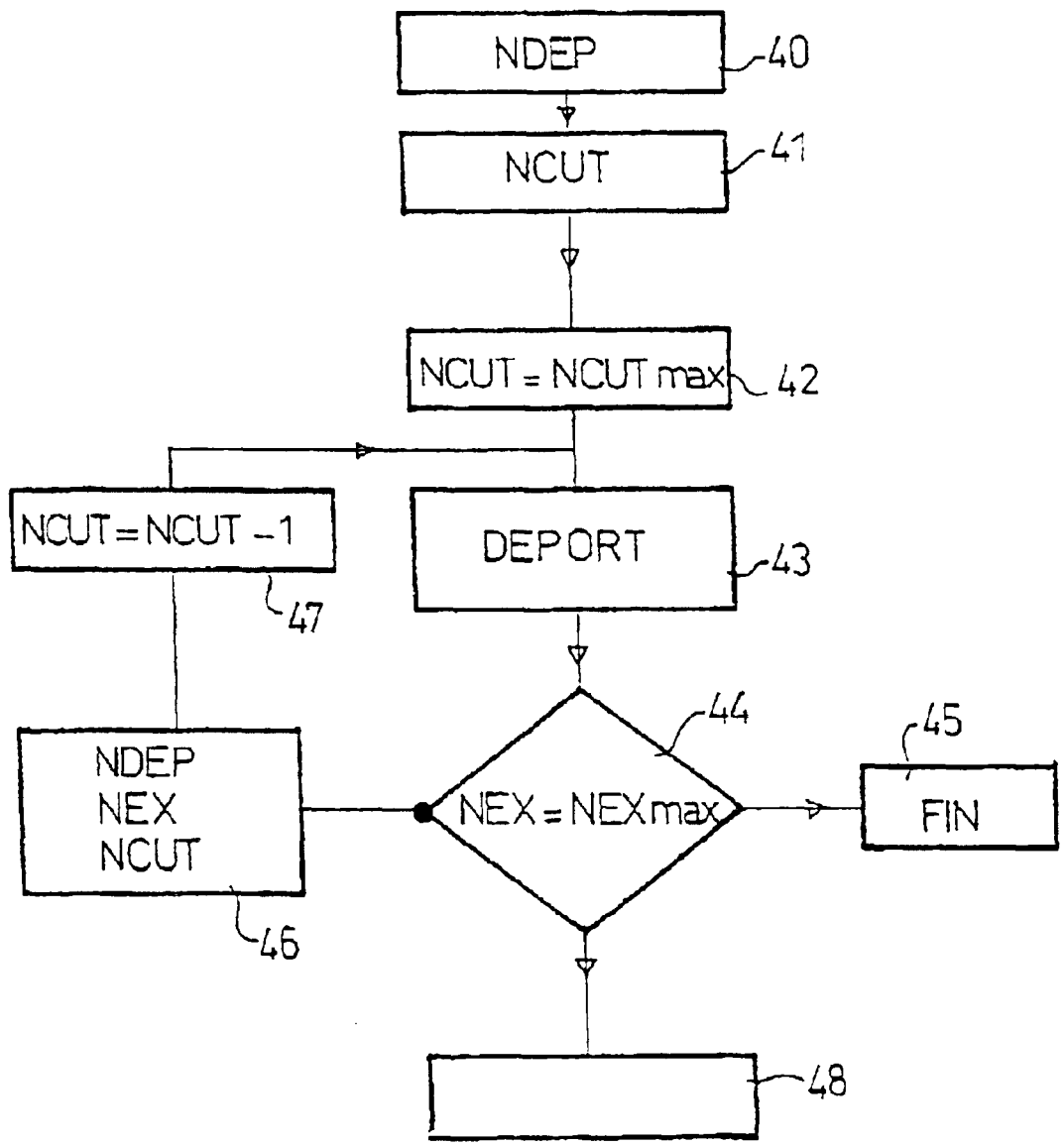

METHOD AND DEVICE FOR AUTOMATIC OPTIMAL LOCATION OF AN OPERATION ON AN INTEGRATED CIRCUIT

The invention relates to a process for the automatic optimal location of a given servicing operation on an integrated circuit, the operation comprising at least one step, particularly measurement, testing, etching, cutting, or deposition, and having to be carried out in a delimited area accessible from the direction of one surface, called the access surface of the integrated circuit, on at least one electrical functional element of an integrated circuit which may be, in particular, an equipotential connection, a node, a junction, or the like. The invention also relates to an installation in which this process is applied.

A modern integrated circuit such as a VLSI circuit comprises a plurality of physical layers, on a silicon substrate, forming an electrical circuit comprising numerous electrical functional elements. For testing and/or analyzing and/or repairing integrated circuits, use is made of installations comprising means for holding an integrated circuit, and servicing means acting on an access surface of the integrated circuit. These servicing means comprise at least a servicing tool adapted to permit the execution of each step, and means for positioning this tool precisely with respect to the access surface. The servicing tools that are conventionally used include focused particle beams (focused ion beams (FIB), electron beams, etc.), for which the access surface is generally the upper surface of the circuit (opposite the substrate), and laser beams, for which the access surface can be the bottom surface of the substrate.

When a servicing operation is planned, the problem arises of selecting the area of the circuit where each step is to be carried out. This is because there are generally very many possibilities for executing each step, all equivalent with respect to the theoretical electrical circuit. For example, an equipotential branch can be cut at any point, an electrical measurement can be made at any point of a branch, and a deposition can be carried out to form a connection between two branches between any two points on these branches. However, these possibilities are not all equivalent in terms of practicality. This is because, in the first place, the servicing area must be accessible to the servicing tool in question from the access surface. Secondly, the difficulty of execution is not always the same; it depends, in particular, on the density of the elements of the circuit in the servicing area in question. Thirdly, the duration of the work can vary considerably. In particular, this duration depends on the depth of the layer on which the work is done (in other words, the distance from the access surface) and the difficulty of accessing the servicing area in question with the tool. In the case of deposition, the duration also depends on the length of the track that is deposited.

Attempts are being made to automate the servicing operations (testing and/or analysis and/or repair) on integrated circuits, and to reduce their risk of failure, their difficulty and their duration, which are essential critical parameters for the industrial development of integrated circuits.

In conventional servicing installations, topographic descriptive data are provided to identify, in each layer of the circuit, a number of polygons, each formed from a characteristic material (metal, polysilicon, etc.) of the circuit. These data are called "layout" data. Data representing the electrical layout of the circuit are also provided. These various data are associated with viewing software enabling each individual area of the circuit to be displayed.

U.S. Pat. No. 5,392,222 describes a process for facilitating the positioning of the view window in such a way that the different tracks of conductive material on which work is to be done are all located in the same window. This process can be used to determine the optimal view window which provides the maximum possible information for diagnosis or repair. The optimal view window then enables the human user to easily select an appropriate location for carrying out the work. However, this document does not provide means of automatically optimizing the location where each step has to be carried out. In particular, it does not provide means of automatically optimizing, within the whole length of an equipotential connection of the electrical circuit, the selection of the polygon on which a step is to be carried out.

The invention is therefore intended to mitigate these drawbacks by providing a process and installation for automatic optimal location of a given servicing operation on an integrated circuit.

The invention is also intended, in particular, to optimize the location of each step of the servicing operation in order to facilitate the execution of the servicing operation and/or to optimize the quality of its execution, particularly by avoiding errors, and/or to minimize its difficulty and total duration. It should be noted that, in case of a servicing operation consisting of a plurality of steps, the minimizing of the total duration of the operation does not necessarily involve the minimizing of the individual duration of each step.

The invention is intended more particularly to provide a process and an installation for automatically determining each initial polygon to be used to carry out each step of the servicing operation, in order to enable and facilitate the execution of the servicing operation, to optimize its quality of execution and/or to minimize its total duration.

The invention is also intended to provide a process which can easily be implemented in a conventional installation for testing and/or analyzing and/or repairing integrated circuits, in order to obtain an installation according to the invention.

For this purpose, the invention relates to a process of automatic optimal location of a servicing operation on an integrated circuit comprising a plurality of physical layers forming an electrical circuit having a plurality of electrical functional elements which may be, in particular, equipotential connections, nodes or junctions, this servicing operation comprising at least one step which may be, in particular, measurement, testing, etching, cutting or deposition, carried out on at least one element of the electrical circuit in a delimited area accessible from the direction of one surface, called the access surface of the circuit, this process comprising a step, called the step of retrieving accessible polygons, in which data are calculated and generated, on the basis of, on the one hand, topographic descriptive data identifying polygons in each layer of the circuit, where each polygon is formed from a characteristic material of the circuit, and, on the other hand, data representing the electrical circuit, in order to identify, for at least each element of the electrical circuit on which at least one step of the servicing operation is to be carried out, the different polygons, called the accessible polygons, which define this element in each layer of the circuit, and on which the servicing tools can be positioned and can carry out at least one step of the servicing operation from the access surface, characterized in that:

for each step of the servicing operation, different options are determined for the execution of this step, corresponding to each of the different accessible polygons, called possible starting polygons, on which this step can be executed, all the different execution options producing results which are equivalent with respect to the electrical circuit, and a rating is calculated and assigned to each execution option as a function of:

the depth of each possible initial polygon of this execution option, represented by the distance separating the layer comprising this polygon from the access surface, and accessibility parameters of each possible initial polygon of this execution option, the optimal execution option to be used for executing each step of the servicing operation is determined automatically, by a numerical optimization calculation using the ratings assigned to the different execution options of each step of the servicing operation.

Thus, in an automatic optimal location process according to the invention, the initial polygon(s) on which each step is carried out are determined automatically by an optimization calculation based on ratings assigned to each of the different possible execution options of each step. Thus there is a considerable reduction of the time required for the operation, since the user, in practice, only has to identify the nature of the steps to be carried out and the element(s) of the circuit in question. Furthermore, the use of an objective optimization calculation ensures that the final choice is the best possible with respect to the desired objectives, as will be manifested subsequently in a lower risk of failure and a greater ease of execution.

Different kinds of optimization calculation can be chosen, according to the applications, the objectives, or the nature of the different servicing operations. Advantageously, according to the invention, the optimization calculation will be adapted to facilitate the execution of the servicing operation and/or to optimize its execution and/or to minimize its total duration. In particular, according to one characteristic of the invention, the optimization calculation is adapted to find, for each step, an optimal execution option such that a multi-polynomial function—particularly the product—of the ratings of the execution options of the different steps has an optimum value, in other words, in particular, a minimum value if the ratings are made to decrease with accessibility, or a maximum value if the ratings are made to increase with accessibility.

Additionally, advantageously and according to the invention, in the retrieval step data are calculated and generated for each element to identify at least one set of accessible polygons which satisfy the following conditions:

they have a surface, called the reduced accessible surface, corresponding to a surface which is not masked in the direction of the access surface by a higher layer of material of the same kind, and whose dimension in each direction between two higher elements is decreased by a value $\alpha i$ which depends on the depth of the layer of the polygon and on the nature of the servicing means to be used on this element, the dimension in each direction of the reduced accessible surface is greater than a minimum threshold value $\beta$, the said reduced accessible surface is separated from all the polygons of the same kind of material belonging to another element by a distance exceeding a specified value $\lambda$.

The process according to the invention is also advantageously characterized in that, for each element, data for a plurality of series of accessible polygons are calculated and generated, with, for each series, a set of values of the parameters $\alpha i$, $\beta$ and $\lambda$; in that an accessibility coefficient is calculated and assigned to each series on the basis of the values of the parameters $\alpha i$, $\beta$ and $\lambda$; and in that this accessibility coefficient is used as an accessibility parameter in the calculation of the rating for the execution options for each step carried out on this element.

Additionally, advantageously and according to the invention, the process is also characterized in that a depth coefficient is assigned to each possible initial polygon, this coefficient varying as a function of the depth of the polygon, and in that the rating for each execution option is calculated according to a bi-polynomial function of the depth coefficient and of the accessibility coefficient of each possible initial polygon.

Advantageously, according to the invention, the area of the reduced accessible surface of each possible initial polygon is used as the accessibility parameter.

Additionally, advantageously and according to the invention, use is made of accessibility parameters which are chosen according to the nature of the step to be carried out and/or according to the characteristics of at least one servicing tool used to execute this step.

Advantageously, according to the invention, the said data identifying the accessible polygons obtained by the retrieval step are numerical data in a format compatible with software for the simultaneous display of at least some of the layout data and the electrical circuit data corresponding to each other, particularly in CIF format, compatible with the Dracula® software marketed by Cadence Design Systems (Paris, France, http://www.cadence.com).

Advantageously, according to the invention, if the servicing operation consists in the cutting of a track of conductive material forming an equipotential connection of the electrical circuit, in the retrieval step, the accessible polygons of one branch of the track are retrieved, this branch being called the upline reduced branch and extending between a specified input point and the first branching node encountered in a specified direction downline from the input point, an accessibility rating is calculated and assigned to each accessible polygon of the upline reduced branch which constitutes an execution option for making the cut, the optimal execution option for making the cut is determined automatically by selecting, from the accessible polygons having optimal accessibility ratings, the one which is nearest to the input point.

Thus the cut is made as near as possible to the input point, enabling the longest possible equipotential connection to be retained downline from the cut. The input point and said specified direction can be user-defined (input) or calculated by a data processing system of the installation.

Advantageously, according to the invention, if the servicing operation consists in the deposition of conductive material between a track, called the mother track, of conductive material forming an equipotential connection, called the mother equipotential connection, of the electrical circuit and a track, called the daughter track, of conductive material forming an equipotential connection, called the daughter equipotential connection, of the electrical circuit, where each execution option comprises a possible initial polygon, called the mother polygon (Pm), of the mother track, and a possible initial polygon, called the daughter polygon (Pf), of the daughter track, the optimal execution option is determined automatically on the basis of at least one calculation of the distance D(Pm, Pf) between the mother polygon (Pm) and the daughter polygon (Pf), with the object of minimizing this distance.

Advantageously, according to the invention, the distance D(Pm, Pf) between the polygons is calculated by considering each polygon to be represented by a segment of straight line projected in a single plane parallel to the access surface.

Advantageously, according to the invention, the distance D(Pm, Pf) between the polygons is calculated as the smallest of the four distances calculated between their respective ends and of the distances between each end of one of these polygons and the orthogonal projection of this end, if it exists, on the other polygon.

Advantageously, according to the invention, the optimal execution option is determined by optimizing the value of an execution rating NEX according to the formula NEX=f(D (Pm, Pf), NACC(Pm), NACC(Pf)), where D(Pm, Pf) is the calculated distance between the mother polygon (Pm) and the daughter polygon (Pf), NACC(Pm) and NACC(Pf) are the accessibility ratings of the mother polygon (Pm) and the daughter polygon (Pf) respectively, calculated in such a way as to be minimal for the polygons having least depth and greatest accessibility, and f is a multipolynomial function.

Advantageously, according to the invention, if the servicing operation consists in the execution of a step of cutting a track, called the daughter track, of conductive material forming an equipotential connection, called the daughter equipotential connection of the electrical circuit, and a step of depositing a track of conductive material between a track, called the mother track, of conductive material forming an equipotential connection, called the mother equipotential connection, of the electrical circuit and a residual portion of the daughter track between the cut and a first branching node encountered in a specified direction downline from the cut, in the retrieval step, at least all the accessible polygons of each mother and daughter track are retrieved, an execution rating is calculated and assigned to each execution option of the deposition step, for all the accessible polygons of the mother track and the daughter track, an execution rating is calculated and assigned to each execution option of the cutting step, the best compromise between the cutting stage and the deposition stage is determined automatically, by determining the optimal execution option of the deposition step corresponding to the cutting step, where only the accessible polygons of the portion of the upline reduced branch of the daughter track extending between the cut and the topological branching node are taken into consideration for the execution options of the deposition step.

The invention also relates to an installation equipped with means of implementing a process according to the invention.

The invention therefore relates to an installation comprising:

means for holding an integrated circuit comprising a plurality of physical layers forming an electrical circuit with a plurality of electrical functional elements, in particular equipotential connections, nodes or junctions, servicing means acting on at least one surface, called the access surface, of an integrated circuit placed on the holding means, these servicing means being adapted to enable a specified servicing operation, comprising at least one step which may be, in particular, measurement, testing, etching, cutting or deposition, to be carried out on at least one element of the electrical circuit, in a delimited area accessible from the direction of the access surface, and means, called accessible polygon retrieval means, for calculating and generating data, on the basis of, on the one hand, topographic descriptive data identifying polygons in each layer of the circuit, where each polygon is formed from a characteristic material of the circuit, and, on the other hand, data representing the electrical circuit, in order to identify, for at least each element of the electrical circuit on which at least one step of the servicing operation is to be carried out, the different polygons, called the accessible polygons, which define this element in each layer of the circuit, and on which the servicing tools can be positioned and can carry out at least one step of the servicing operation from the access surface, characterized in that it comprises:

means for determining, for each step of the servicing operation, different execution options for this step, corresponding respectively to each of the different accessible polygons, called the possible initial polygons, on which this step can be carried out, all the different execution options producing results which are equivalent with respect to the electrical circuit, and for calculating and assigning a rating to each execution option as a function of:

the depth of each possible initial polygon of this execution option, represented by the distance separating the layer comprising this polygon from the access surface, and accessibility parameters of each possible initial polygon of this execution option, means for automatically determining the optimal execution option to be used for executing each step of the servicing operation, by a numerical optimization calculation using the ratings assigned to the different execution options of each step of the servicing operation.

An installation according to the invention is suitable for the implementation of a process according to the invention, and comprises, in particular, data processing means for numerical calculation, suitable for processing the data and carrying out the optimization calculation. A process according to the invention is therefore implemented in and by means of an installation according to the invention.

The invention also relates to a process and an installation characterized in combination by all or some of the characteristics mentioned above or below.

Other objects, characteristics and advantages of the invention will be made clear by the following description which refers to the attached figures in which FIG. 1 is a diagram of an example of an FIB installation according to the invention;

FIG. 3 is an example of a file in CIF format, in which the data representing accessible polygons of an element of the electrical circuit of an integrated circuit are recorded, and which can be used in a process according to the invention;

FIG. 6 is a schematic flow chart of an optimization calculation of a process according to the invention in the case of a cutting/deposition operation.

Figure 1:
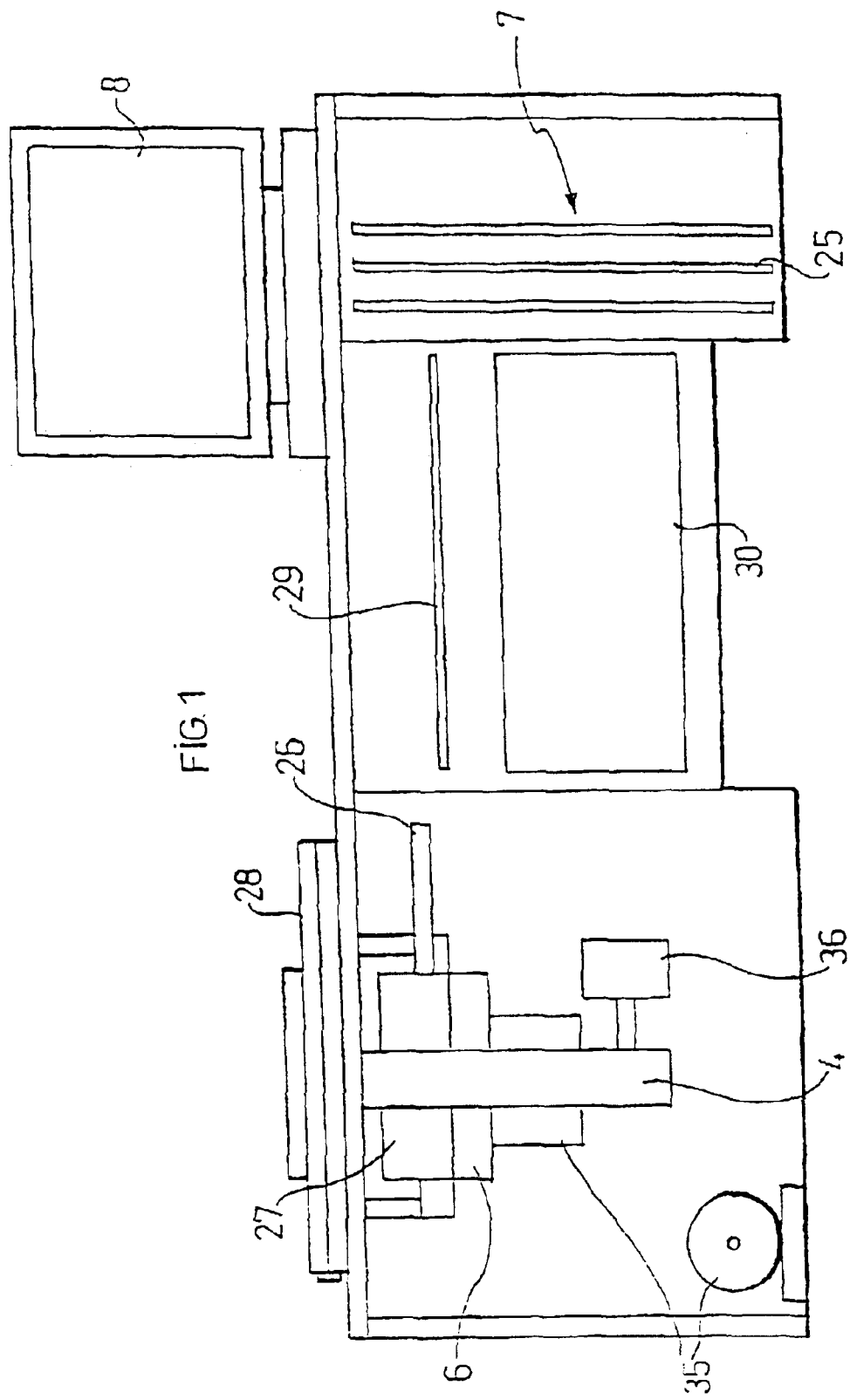
Figure 2:
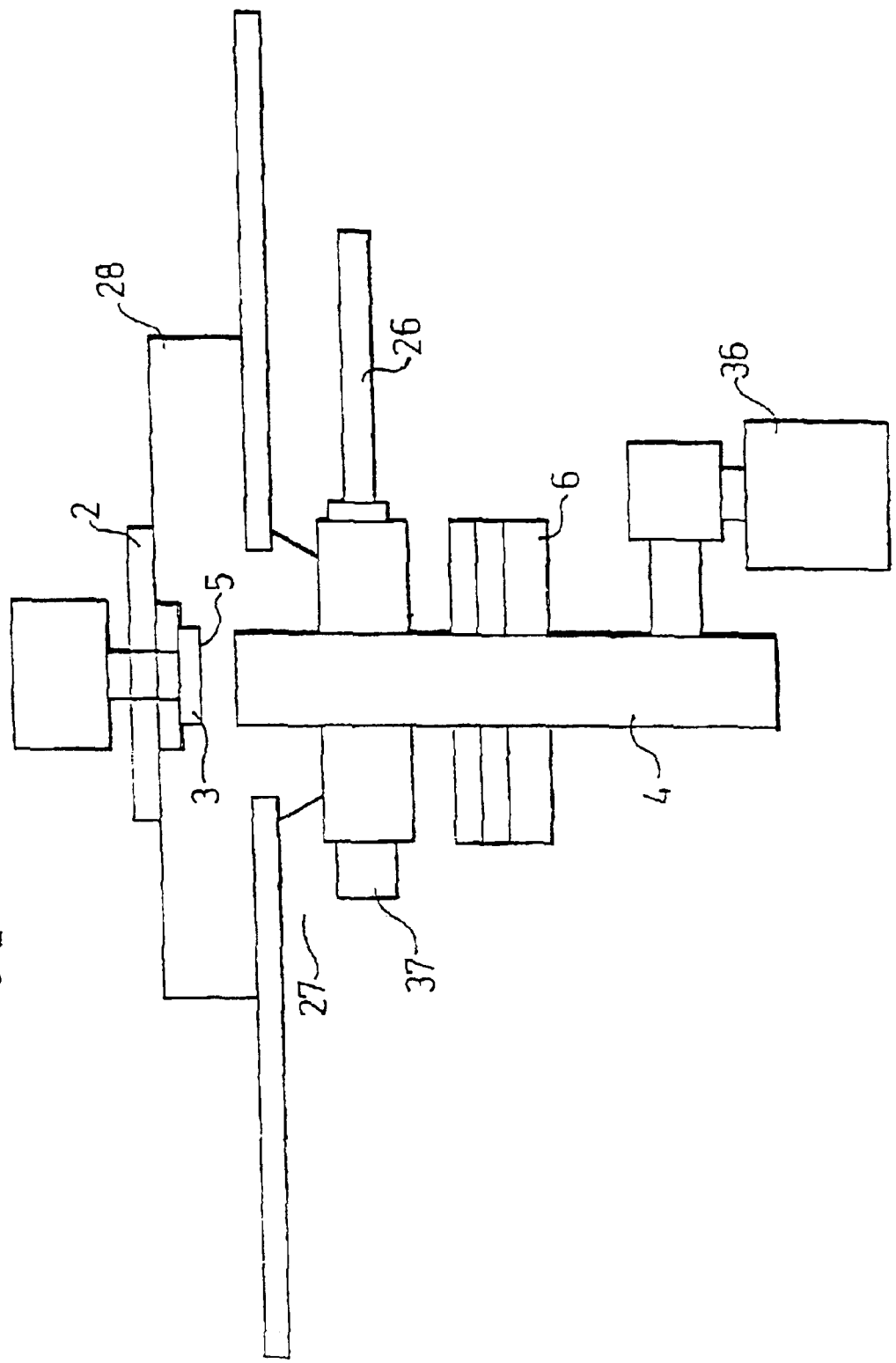
FIG. 2 is a more detailed schematic view of the integrated circuit servicing means and holding means of an FIB installation according to the invention.

An installation for testing and/or analyzing and/or repairing integrated circuits is well known and does not require detailed description, a knowledge of its general characteristics being assumed. It can consist, in particular, of a focused ion beam (FIB) installation as shown in FIGS. 1 and 2, and/or an electron beam and/or laser beam installation such as a Schlumberger IDS system (IDS P3X, IDS10000, IDS2000, etc.). For example, U.S. Pat. No. 5,392,222 describes these installations and the method of using them to retrieve accessible polygons. U.S. Pat. Nos. 4,706,019, 4,721,909 and 5,140,164 describe the Schlumberger IDS system in greater detail.

An installation of this type comprises a support 2 for an integrated circuit 3 to be treated, and at least one servicing tool 4 such as a focused ion beam and/or an electron beam suitable for carrying out a servicing operation on a surface, called the access surface 5, of the circuit 3 placed on the support 2. The installation is also provided with means 6 for the precise positioning of the tool 4 on the access surface 5, enabling the tool 4 to be moved and held along the X and Y axes, in other words perpendicularly to the axis of the beam, at any specified point of this access surface 5.

In FIG. 1, an FIB installation comprises an FIB column, a charged particle detector 26, means 37 for injecting appropriate gases, and, if required, an electron gun, the whole being mounted on an XY positioning stage 6, in a scintillation chamber 27, in a vacuum chamber 28 comprising the support 2 for the circuit 3. It also comprises a data processing system 7 comprising human user interface means (screen 8, keyboard, mouse, etc.), a central unit 25, means 29 for interfacing with and controlling the FIB column 4, means 30 for controlling the XY stage 6, pumping means 35 controlled by the system 7 for establishing a vacuum in the chambers 27 and 28, and an ion pump 36.

The data processing system 7 can store layout data for an integrated circuit 3 to be treated, in other words topographic descriptive data identifying, for each layer of the circuit 3, a number of polygons, each formed from a characteristic material of the circuit 3, in particular an electrically conductive material (metal), polysilicon, etc.; data known as technology data, representing the possibilities for connecting the different polygons, the different overlaps between tracks of the circuit, the corresponding binary files, the natures of the different nodes, junctions, etc., and the graphic display options; and data representing the electrical circuit of the integrated circuit 3.

The topographic descriptive data are generally recorded in at least one Layout file in CIF (Caltech Interchange Format), which is a text format that can easily be understood and used by a human user, or in GDSII (binary format) or another format.

The technology data are recorded in a Technology file in the format known as ECAD, which is compatible with computer-assisted design software, and which can easily be understood and used by a human user.

The data representing the electrical circuit are recorded in a Netlist file in the format(s) known as SPICE and/or EDIF, which describe the functional organization of the electrical nodes of the circuit 3.

The data processing system 7 can display on its display screen 8 view windows for layout data and for electrical circuit data which correspond to each other.

For this purpose, a display software such as the DF2® software produced by Cadence Design Systems, compatible with the Dracula® software, is implemented in the data processing system 7. This software can display a Layout window, showing the layout data of the circuit 3, on the basis of the Layout file and according to different options which are defined in the Technology file, and, simultaneously, a Netlist window, showing the electrical circuit data; at the same time, it establishes a link between the data of the Layout and the Netlist windows. Thus, if the operator selects a node name from the list of nodes in the Netlist window showing the electrical circuit data, the visible polygons of an equipotential connection corresponding to this node will appear in white in the Layout window showing the layout data. Conversely, if the operator selects an equipotential connection in the Layout window, the name of the corresponding node will be highlighted in the Netlist window.

In a process according to the invention, at least one series of polygons accessible from the access surface 5 of the circuit 3 is initially retrieved for each element, particularly for each equipotential connection, of the circuit 3 on which at least one step is to be carried out.

The Dracula® software can be used to retrieve the accessible polygons, and to generate a new file of layout data corresponding to these accessible polygons, in a format, particularly a CIF or GDSII format, compatible with this software and with the electrical circuit data.

For this purpose, the parameters of the Technology file are modified, particularly in accordance with the possibilities offered by the tool 4 which is used and with the access surface 5, in order to establish rules which delete the portions of polygons masked by higher layers, and to take into account the inaccuracies of the tool 4 (cone angle of the beam (coefficients $\alpha i$), minimum width of the track on which it can act (coefficient $\beta$), minimum distance between tracks (coefficient $\lambda$).

Thus the Technology file can be adapted to generate data identifying at least one series of accessible polygons which satisfy the following conditions:

they have a surface, called the reduced access surface, defined as a surface, in the direction of the access surface 5, which is not masked by a higher layer of material of the same kind, and whose dimension in each direction between two higher elements is decreased by a value $\alpha i$ which depends on the depth of the polygon's layer and on the nature of the servicing tools 4 to be used on this element, the dimension in each direction of the reduced accessible surface is greater than a minimum threshold value $\beta$, the said reduced accessible surface is separated by a distance greater than a specified value $\lambda$ from all the polygons of material of the same kind belonging to another element.

The command "RESIZE CMi by $\alpha i$", where CMi are the different layers of the circuit 3, is used to allow for the cone angle of the beam 4. The instruction "FILTER" is used to allow for the minimum dimension coefficient $\beta$. In order to allow for the minimum spacing $\lambda$ between two separate tracks, the polygons which do not satisfy this condition are considered to be invisible.

By varying the values of the coefficients $\alpha i$, $\beta$ and $\lambda$, it is possible to generate a plurality of series of accessible polygons, with the accessibility criteria differing between one series and the next, for example a series of highly accessible polygons, a series of averagely accessible polygons, and a series of poorly accessible polygons.

Several methods can be used to obtain these series of data in CIF or GDSII format. The problem which arises is simply that of retrieving the binary data created by the Dracula® software and converting them into the CIF or GDSII format, while providing a link between the numbers assigned to the elements of the circuit 3 by the layout data, the Dracula® software, and the electrical circuit data.

In a first variant, the "GEN-XRF-RPT=YES" command of the Dracula® software (version 4.7) can be used to generate the text files FMETi.DAT directly from the binary files METALi.DAT and POLY.DAT generated by the Dracula® software. This command also produces the NETXREF.DAT file in text format, containing the cross-reference data forming the link between the name of each node in the Netlist file, and the node number in this Netlist file, and a number assigned to the polygons of this node by the Dracula® software, and it is then possible to find, from a node name in the Netlist file, the Dracula® number corresponding to the accessible polygons of this node. For this purpose, use can be made of the attached CROSS-REF2 program, for example.

Data corresponding to the desired format are retrieved from these Dracula® numbers, and recorded in a store of the data processing system 7, for example by using the attached NOEUD2.C program. For each node, a file such as the CIF file shown in FIG. 3 is obtained. In this file, the field L defines the layer of the polygons (CMi: metal layer; CP: polysilicon layer). Each field P defines a polygon by the coordinates of its four vertices.

If necessary, the accessible polygons which are obtained can also be transformed to quadrilaterals if the polygons in the Layout file are not all quadrilaterals.

This first variant can also be used to automatically retrieve the accessible polygons, layer by layer, corresponding to a node (equipotential connection) whose name has been specified as it appears in the Netlist window.

In a second variant, the user can use a pointing device (mouse) of the data processing system 7 to select in the Layout window the equipotential connection on which he wishes to operate. He can then note the Dracula® number which is displayed in the Layout window.

If desired, a program can also be used to retrieve the Dracula® number, starting with an FMETi.DAT file and the coordinates of the point selected by the user. The same program can be used if the user only has the layout data available, and not the electrical circuit data.

Starting from the Dracula® number, the attached NOEUD2.C program is launched; this provides the corresponding CIF file.

This second variant is therefore a graphic variant for obtaining the CIF file of accessible polygons of an equipotential connection.

The same process can be repeated for all the equipotential connections on which the servicing operation is to be carried out.

This process can also be repeated several times with different Technology files, to obtain several series of accessible polygons, according to their degree of accessibility, particularly with different coefficients $\alpha i$, $\beta$, $\lambda$. In the first variant, each Technology file can be used to obtain a series of METALi.DAT and POLY.DAT binary files, from which the accessible polygons are found in the form of files in CIF format. In the second variant, the Technology file modifies the image obtained in the Layout window to show only the accessible polygons therein.

Measurement or Testing Operation:

When the accessible polygons have been retrieved, if the servicing operation is a simple step of measurement or testing carried out on an element of the circuit such as an equipotential connection, a junction, etc., each accessible polygon is a possible initial polygon on which the measurement is to be carried out, and is therefore an execution option for this step. To optimize this measurement, an accessibility rating NACC is assigned to each accessible polygon of the element.

To calculate this accessibility rating NACC, a depth coefficient COP is assigned to each possible initial polygon, this coefficient being proportional to the depth of the layer in which it is located with respect to the access surface 5. This coefficient COP can be, for example, simply the number of the layer in which it is located, the layers being numbered in increasing or decreasing order from the access surface 5. Additionally, for each series of accessible polygons, an identical accessibility coefficient CACC is assigned to each polygon of the series according to the value of the coefficients $\alpha i$, $\beta$, $\lambda$. This accessibility coefficient can also be a simple integer corresponding to the number of the series, the series being numbered in increasing order, or in decreasing order, from the series most easily accessible by the tool 4 from the access surface 5.

The accessibility rating NACC can be calculated as a bi-polynomial function of the depth coefficient COP and the accessibility coefficient CACC, particularly as the product of these coefficients.

In the case of measurement, a more complex function, prioritizing the accessibility coefficient CACC, can be used. The reliability of the measurement increases with the distance of the polygon on which it is carried out from the polygons of other tracks in the same layer or in higher layers.

The data processing system 7 is programmed to calculate this accessibility rating for all the possible initial polygons and to determine the polygon (or polygons) which have the optimum accessibility rating, in other words a minimum or a maximum rating, depending on whether the coefficients COP and CACC are respectively increasing or decreasing from the access surface 5 and from the most easily accessible series.

If more than one possible initial polygon has the optimum accessibility rating, the one which is chosen will be, for example, the one whose area is greatest, or the one corresponding to a preferred shape criterion (angle, etc.). The area is calculated from the previously retrieved data on accessible polygons (FIG. 3), and is therefore equal to the reduced accessible surface of each polygon.

In another variant, it is possible to incorporate the value of this area directly in the accessibility rating calculation function, which can be, in particular, a tri-polynomial function of the coefficients COP and CAPP and the area of the polygons.

Thus the optimal initial polygon is determined automatically and forms the optimal execution option for the measurement or test operation in question, and the servicing tool 4 is positioned at least approximately in the centre of the polygon to carry out the corresponding measurement step.

The coefficients $\alpha i$, $\beta$, $\lambda$ used to obtain the series of polygons are determined according to the nature of the tool 4 (non-contact probe, contact probe, laser, etc.).

This measurement or test operation can be carried out from the upper surface, opposite the substrate, of the circuit 3, which forms the access surface 5, for example in order to measure currents or potentials of a track of conductive material. Conversely, it can also be carried out from the lower surface of the substrate of the circuit 3, which then forms the access surface 5, for example in the case of laser measurement on the junctions.

Cutting Operation:

For an operation of cutting a track 10 forming an equipotential connection of the electrical circuit of conductive material, it is important to make this cut 17 upline from any topological branching node 11 in order to be certain that the input IN of this track 10 is disconnected from all the branches 12, 13, 14, 15 and cells located downline, in other words from the outputs OUT1, OUT2, OUT3 of the equipotential connection 10.

The cut 17 must also be made as near as possible to the input IN, to leave the largest number of possible initial polygons for a subsequent deposition or other operation.

Consequently, after the retrieval of all the accessible polygons of the track 10 in the retrieval step, the accessible polygons belonging to a branch of the track 10, called the reduced upline branch 16, are retrieved, the latter branch extending between a specified input point IN and the first topological branching node 11 encountered downline of the input point IN, in a specified direction equal to the direction of travel of the electrical signal in the track 10 (the terms "upline" and "downline" relate to this direction throughout the text).

In order to retrieve the accessible polygons of the reduced upline branch 16, it is possible to use, for example, the attached program NOEUD-TOPOLOGIQUE2.C.

This program ranks the accessible polygons of the reduced upline branch 16 on the basis of the corresponding CIF file, starting from the polygon containing the input point IN selected by the user with the pointing device (mouse). The polygons are first sorted layer by layer according to the coordinates (xmin, ymin) of their lower left-hand corners.

The layout data files nVIA.DAT and nCONTACT.DAT, defining the connections between the layers of the circuit 3 for each node n of the electrical circuit, are then used to place the accessible polygons of the reduced upline branch 16 in order with respect to the routing of the signal, from the input point IN to the first topological branching node 11 encountered downline from the input point IN.

When this has been done, each accessible polygon of the reduced upline branch 16 forms an execution option for the cutting step to be carried out.

In order to determine the optimal execution option automatically, an accessibility rating NACC, calculated as indicated above for the measurement operation, as a function of a depth coefficient COP and an accessibility coefficient CACC, is assigned to each possible initial polygon.

The polygon(s) having the optimal accessibility ratings are then determined, and the polygon which is nearest to the input point IN is chosen from among these as the optimal execution option, in such a way that the largest possible portion 16b is retained between the cut 17 and the topological branching node 11 located downline, for a subsequent operation.

The attached program CUT.C is an example of a program for finding this optimal initial polygon where there is only one series of accessible polygons.

Deposition Operation:

The servicing operation can consist in a step of depositing conductive material between a track 20, called the mother track, of conductive material forming an equipotential connection, called the mother equipotential connection, of the electrical circuit and a track 10, called the daughter track, of conductive material forming an equipotential connection, called the daughter equipotential connection 10, of the electrical circuit.

In this case, at least one set of accessible polygons is retrieved from each of the mother track 20 and the daughter track 10. Each execution option for this step is then defined by a possible initial polygon, called the mother polygon Pm, chosen from a series of accessible polygons of the mother track 20, and a possible initial polygon, called the daughter polygon Pf, chosen from a series of accessible polygons of the daughter track 10.

In order to optimize this deposition step, it is first necessary, where an FIB is used, to allow for the fact that the step becomes more hazardous and costly with an increase in the distance between the mother and daughter polygons to be connected. It is therefore preferable to accept the execution option in which the mother polygon Pm and the daughter polygon Pf are closest to each other. For this purpose, at least one calculation of the distance between each pair of mother polygons Pm and daughter polygons Pf is carried out, the object being to minimize this distance.

Figure 5:
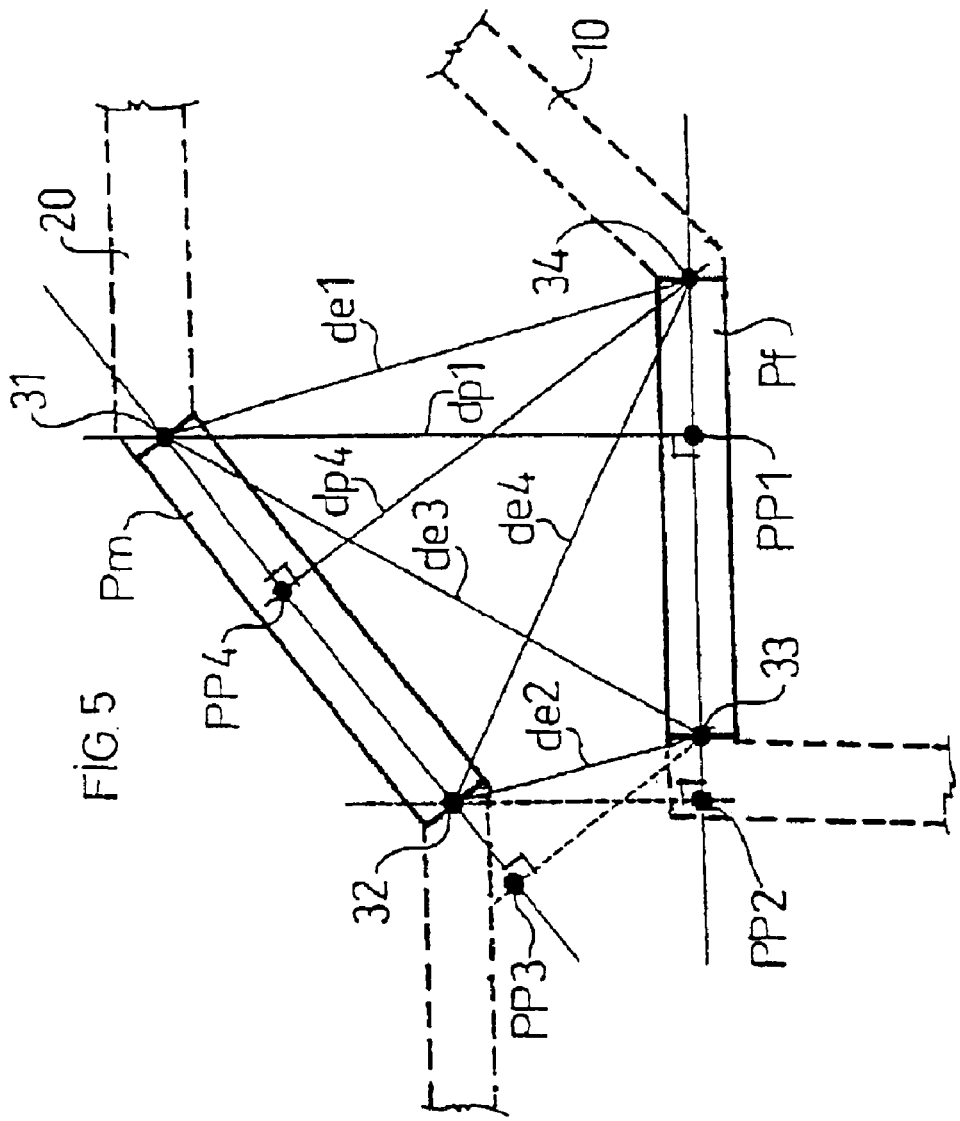
FIG. 5 is a partial diagram showing two accessible polygons, one belonging to a mother track and one to a daughter track, which are to be linked by deposition, for the calculation of their distance by a process according to the invention.

This distance calculation can be carried out as shown in FIG. 5. Each polygon is considered to be represented by a segment of straight line projected in a single plane parallel to the access surface 5, even if the polygons belong to different layers. This segment of straight line is determined by the longitudinal median line of the polygon, calculated from the coordinates of each corner of the polygon.

The distance between the mother polygons Pm and daughter polygons Pf is then calculated as the smallest value of the four distances de1, de2, de3, de4 calculated between their ends 31 to 34 respectively, and of the distances dp1, dp4 between each end 31 to 34 of one of these polygons Pm, Pf and the orthogonal projection PP1 to PP4 of this end 31, 34, if present, on the other polygon Pf, Pm. The four distances de1, de2, de3, de4 which separate the paired ends 31, 32, 33, 34 of the segments of straight line representing the mother and daughter polygons are therefore calculated. The coordinates of the points called the projected points PP1, PP2, PP3, PP4 are then calculated, each of these points being the orthogonal projection of one end 31, 32, 33, 34 of a segment of straight line of one polygon on the straight line containing the segment of straight line of the other polygon. In FIG. 5, PP1 is the projection point of the end 31 of the mother polygon Pm on the straight line containing the daughter polygon Pf; PP2 is the projection point of the end 32 of the daughter polygon Pf on the straight line containing the mother polygon Pm; PP3 is the projection point of the end 33 of the mother polygon Pm on the straight line containing the daughter polygon Pf; and PP4 is the projection point of the end 34 of the daughter polygon Pf on the straight line containing the mother polygon Pm.

In the example in FIG. 5, since PP2 and PP3 are located outside the segment of straight line of the daughter polygon and mother polygon respectively, they are eliminated and are not used for the distance calculation. The distances dp1 and dp4 between each end 31, 34 of the segment of straight line of one polygon and its orthogonal projection PP1, PP4, if present, on the segment of straight line of the other polygon are therefore calculated. As a general rule, there are four distances of this kind. The distance D(Pm, Pf) between the polygons Pm and Pf is then calculated as the minimum value of the distances calculated previously, or in other words, in the example in FIG. 5:

$$D(Pm, Pf)=\text{MIN}\ (de1,\ de2,\ de3,\ de4,\ dp1,\ dp4)$$

$$D(Pm, Pf)=de2$$

When this distance has been calculated for all the pairs of mother and daughter polygons, a check is made as to whether there is at least one pair of polygons which both belong to the upper layer of the access surface 5 and for which the distance D(Pm, Pf) is smaller than a specified threshold value, for example $200\mu$. This is because, as is known, it is generally difficult to form contacts with deep layers. A longer deposition is therefore favored if the mother and daughter polygons belong to the upper layer.

If there is a plurality of pairs of polygons satisfying this condition, a rating, called the execution rating NEX, is calculated by the formula NEX=f(D(Pm, Pf), NACC(Pm), NACC(Pf)), where NACC(Pm) is the accessibility rating of the mother polygon and NACC(Pf) is the accessibility rating of the daughter polygon, and f is a multipolynomial function of these three parameters. The option having the best NEX rating is then chosen.

For example, in the case of an FIB, the formula NEX= D(Pm·Pf)×NACC(Pm)×NACC(Pf) can be used, and the option which minimizes the NEX rating is chosen. In the case of a laser beam, the distance D(Pm, Pf) is preferably assigned a weighting coefficient which is smaller than the NACC accessibility ratings. This is because accessibility is a more important criterion than distance in this case.

The accessibility ratings are calculated, as described for the measurement step, with depth coefficients COP and accessibility coefficients CACC of each polygon, but in such a way as to be minimal for the polygons having least depth and greatest accessibility.

The execution option having the lowest execution rating NEX is then chosen.

The attached program DEPOTOPT.C is an example of the implementation of this optimization calculation in the case of a single series of accessible polygons for each track 10, 20, the accessibility ratings being reduced to the depth coefficients COP.

Figure 4:
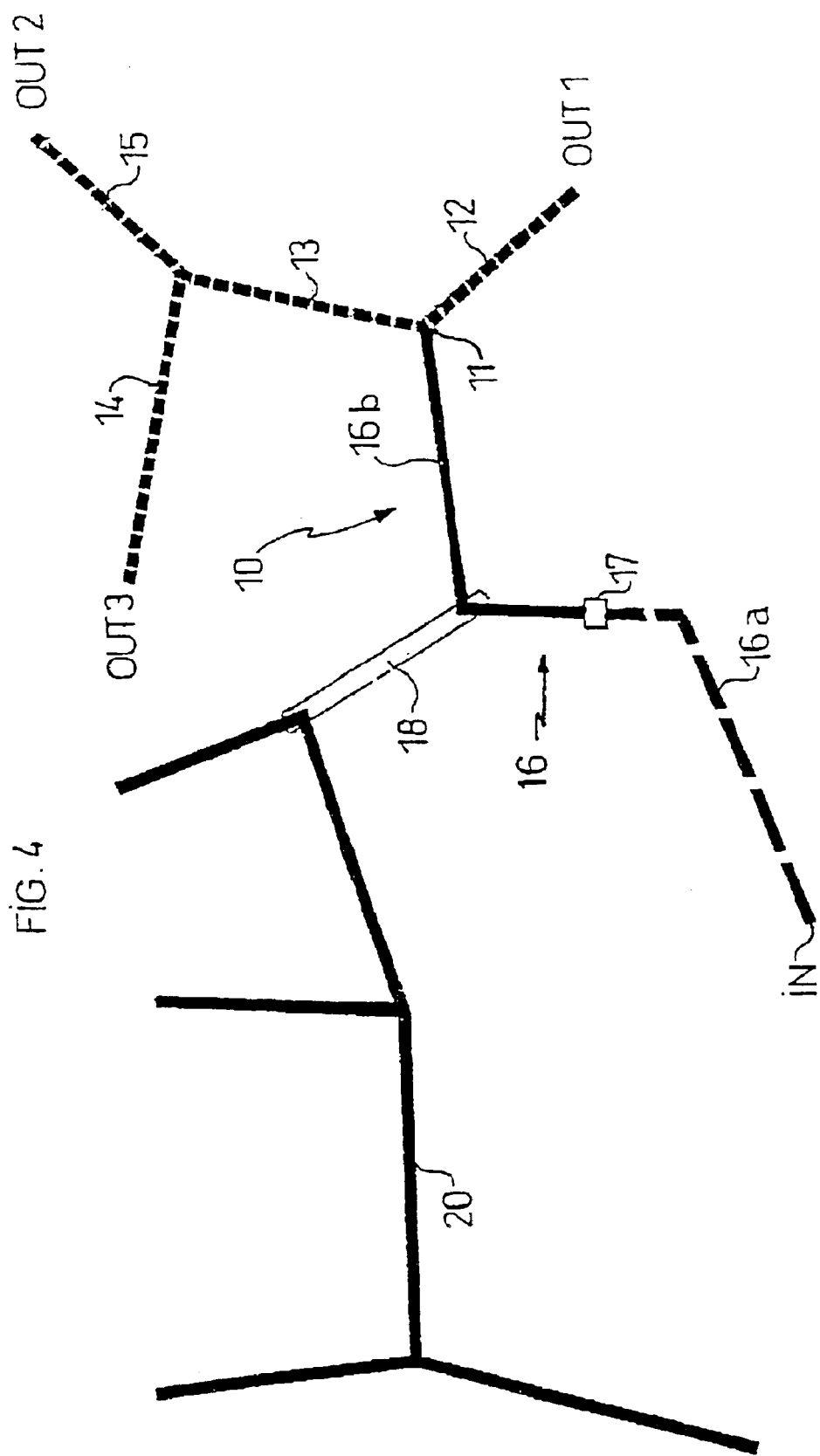
FIG. 4 is a partial diagram showing a mother track and a daughter track which can be subjected to a cutting/ deposition operation by a process according to the invention.

Cutting/Deposition Operation:

Another servicing operation commonly carried out on a circuit to be repaired consists of a step 17 of cutting a track, called the daughter track 10, of conductive material forming an equipotential connection, called the daughter equipotential connection of the electrical circuit, and a step of depositing a track of conductive material 18 between a track, called the mother track 20, of conductive material forming an equipotential connection, called the mother equipotential connection, of the electrical circuit and a residual portion 16b of the daughter track 10 between the cut 17 and a first branching node 11 encountered in a specified direction downline from the cut 17. An example of this kind of servicing operation is shown in FIG. 4.

It is then necessary to determine the best compromise between the two successive steps of cutting and deposition, namely a low-risk cutting step (carried out on a shallow layer and a very accessible polygon) and the shortest possible deposition 18 between polygons which are also as shallow and accessible as possible.

For this purpose, it is advantageous to follow the flow chart shown in FIG. 6.

It should be noted that the following two conditions must be satisfied if this servicing operation is to be carried out correctly:

the cut 17 must be made upline from any topological branching node 11 of the daughter track 10, in other words on the reduced upline branch 16;

the deposition 18 must be connected to the portion 16b of the reduced upline branch 16 between the cut 17 and the first topological branching node 11 located downline, and not to the portion 16a extending between the input IN and the cut 17, in such a way that all the branches 12, 13, 14, 15 and cells downline are connected to the mother track 20.

In an initial step 40, an execution rating NEX is calculated and assigned to each execution option for the step of deposition between the mother track 20 and daughter track 10, without consideration of the two aforementioned conditions, and in relation to a deposition operation only, as described above. The optimal option with the execution rating NEXmax is then determined, and the execution options for the deposition step are ranked by their execution rating, a ranking number NDEP being assigned to each option.

In a subsequent step 41, all the execution options for the step of cutting 17 on the reduced upline branch 16 of the daughter 10 are ranked according to their accessibility ratings, and, for options having the same accessibility ratings, according to their distance from the input point IN, and an input ranking number NCUT is assigned to each of them, this number decreasing, for example, from the optimal execution option (having the best accessibility rating and being nearest to the input point IN) to the least good option. The ranking number NCUT therefore increases with the quality of the execution options. It should be noted that this ranking number NCUT can be considered as an execution rating for the cutting step.

In the subsequent step 42, the execution option for the cutting step having the best ranking number NCUTmax is selected, independently of the deposition step. With this option, the corresponding optimal deposition option DEPOPT is recalculated in step 43, as described above in relation to a deposition operation only, but only the polygons of the portion 16b of the reduced upline branch located between the cut 17 and the topological branching node 11 are considered for the daughter track 10.

A check is then made in step 44 to determine whether the execution rating NEX of this optimal deposition DEPOPT is equal to NEXmax or not, in other words whether this optimal deposition corresponds to an optimal execution option, independently of the cutting step. If this is the case, the optimization calculation is terminated at step 45, since the execution options for the cutting and deposition steps which are independently optimal are also optimal in combination. If this is not the case, the three values NDEP, NEX and NCUT of these execution options (cutting and corresponding optimal deposition DEPOPT) are recorded in step 46.

In the following step 47, the ranking number NCUT of the cutting step is decreased by unity, so that the execution option with the next lowest quality is selected, and the steps 43, 44 and 46 are repeated until the values NDEP, NEX and NCUT for all the execution options of the cutting step have been stored.

At the end of this loop, it is determined in step 48 from all these combinations of NDEP, NEX and NCUT the one which corresponds to the optimum compromise. There are various possible ways of doing this. In a first variant, the combination having an execution rating NEX with the optimal value NEXOPT (the highest) for the deposition step can be chosen. In a second variant, a combination having the largest product NEX×NCUT, and also, if required, an optimal deposition execution rating NEX, can be chosen. More generally, it is possible to choose a combination for which a specified function, in particular a bi-polynomial function, of the execution rating NEX of the deposition step and the execution rating (ranking number) NCUT of the cutting step has an optimal value. If there is more than one such combination, the one having the best deposition execution rating NEX or the best cutting execution rating NCUT can be chosen.

The choice among these variants can be made, in particular, according to the nature of the integrated circuit 3 and/or according to the characteristics of the tool 4 (focused ion beam) which is used.

The functions of a process according to the invention are implemented by a data processing system 7 which is programmed for this purpose, and in which the corresponding requisite data are stored.

The invention can be varied in numerous ways from the embodiments and variants described above. For example, other steps can be combined and simultaneously optimized for the purposes of a servicing operation; other optimization calculations can be applied (for example, by using multi-polynomial functions of ratings other than a simple product). The invention can also be applied to installations and software other than those described.

The source programs appended below are written in C language and show, by way of example, a simplified version of the process according to the invention.

What is claimed is:

1. A process for automatic optimal location of a servicing operation on an integrated circuit (3) comprising a plurality of physical layers forming an electrical circuit having a plurality of electrical functional elements, this servicing operation comprising at least one step, carried out on at least one element of the electrical circuit in a delimited area accessible from the direction of one surface, called the access surface (5) of the circuit (3), wherein:

this process comprises a step, called the step of retrieving accessible polygons, in which data are calculated, on the basis of, on the one hand, topographic descriptive data identifying polygons in each layer of the circuit (3), where each polygon is formed from a characteristic material of the circuit (3), and, on the other hand, data representing the electrical circuit, in order to identify, for at least each element of the electrical circuit on which at least one step of the servicing operation is to be carried out, the different polygons, called the accessible polygons, which define this element in each layer of the circuit (3), and on which the servicing tools can be positioned and can carry out at least one step of the servicing operation from the access surface (5), according to at least one accessibility rule, for each step of the servicing operation, different options are determined for the execution of this step, corresponding to each of the different accessible polygons, called possible starting polygons, on which this step can be executed, all the different execution options producing results which are equivalent with respect to the electrical circuit, and a rating is calculated and assigned to each execution option as a function of:

the depth of each possible starting polygon of this execution option, represented by the distance separating the layer comprising this polygon from the access surface (5), and accessibility parameters of each possible starting polygon of this execution option, the optimal execution option to be used for executing each step of the servicing operation is determined automatically, by a numerical optimization calculation using the ratings assigned to the different execution options of each step of the servicing operation.

2. The process as claimed in claim 1, characterized in that the optimization calculation is adapted to facilitate the execution of the servicing operation and/or to optimize the quality of its execution and/or to minimize its total duration.

3. The process as claimed in claim 1, characterized in that the optimization calculation is adapted to find, for each step, an optimal execution option such that a multipolynomial function, particularly the product of the ratings of the execution options of the different steps has an optimum value.

4. The process as claimed in claim 1, characterized in that, during the retrieval step, data are calculated and generated for each element to identify at least one series of accessible polygons which satisfy the following conditions:

they have a surface, called the reduced accessible surface, corresponding to a surface which is not masked in the direction of the access surface by a higher layer of material of the same kind, and whose dimension in each direction between two higher elements is decreased by a value $\alpha i$ which depends on the depth of the layer of the polygon and on the nature of the servicing means to be used on this element, the dimension in each direction of the reduced accessible surface is greater than a minimum threshold value $\beta$, the said reduced accessible surface is separated from all the polygons of the same kind of material belonging to another element by a distance exceeding a specified value $\lambda$.

5. The process as claimed in claim 4, characterized in that, for each element, data for a plurality of series of accessible polygons are calculated and generated, with, for each series, a set of values of the parameters $\alpha i$, $\beta$ and $\lambda$; in that an accessibility coefficient is calculated and assigned to each series on the basis of the values of the parameters $\alpha i$, $\beta$ and $\lambda$; and in that this accessibility coefficient is used as an accessibility parameter in the calculation of the rating for the execution options for each step carried out on this element.

6. The process as claimed in claim 5, characterized in that a depth coefficient is assigned to each possible initial polygon, this coefficient varying as a function of the depth of the polygon, and in that the rating for each execution option is calculated according to a bi-polynomial function of the depth coefficient and of the accessibility coefficient of each possible initial polygon.

7. The process as claimed in claim 4, characterized in that the area of the reduced accessible surface of each possible initial polygon is used as the accessibility parameter.

8. The process as claimed in claim 1, characterized in that use is made of accessibility parameters which are chosen according to the nature of the step to be carried out and/or according to the characteristics of at least one servicing tool (4) used to execute this step.

9. The process as claimed in claim 1, characterized in that the said data identifying the accessible polygons obtained by the retrieval step are numerical data in a format compatible with software for the simultaneous display of at least some of the layout data and the electrical circuit data corresponding to each other.

10. The process as claimed in claim 1, characterized in that, if the servicing operation consists in the cutting (17) of a track (10) of conductive material forming an equipotential connection of the electrical circuit:

in the retrieval step, the accessible polygons of one branch of the track (10) are retrieved, said branch being called the upline reduced branch (16) and extending between a specified input point (IN) and the first branching node (11) encountered in a specified direction downline from the input point (IN), an accessibility rating is calculated and assigned to each accessible polygon of the upline reduced branch (16), which constitutes an execution option for making the cut (17), the optimal execution option for making the cut (17) is determined automatically by selecting, from the accessible polygons having optimal accessibility ratings, the one which is nearest to the input point (IN).

11. The process as claimed in claim 1, characterized in that, where the servicing operation consists in the deposition

(18) of conductive material between a track, called the mother track (20), of conductive material forming an equipotential connection, called the mother equipotential connection, of the electrical circuit and a track, called the daughter track (10), of conductive material forming an equipotential connection, called the daughter equipotential connection, of the electrical circuit, where each execution option comprises a possible initial polygon, called the mother polygon (Pm), of the mother track (20), and a possible initial polygon, called the daughter polygon (Pf), of the daughter track (10), the optimal execution option is determined automatically on the basis of at least one calculation of the distance D(Pm, Pf) between the mother polygon (Pm) and the daughter polygon (Pf), with the object of minimizing this distance.

12. The process as claimed in claim 11, characterized in that the distance D(Pm, Pf) between the polygons is calculated by considering each polygon to be represented by a segment of straight line projected in a single plane parallel to the access surface (5).

13. The process as claimed in claim 11, characterized in that the distance D(Pm, Pf) between the polygons is calculated as the smallest of the four distances (de1, de2, de3, de4) calculated between their respective ends (31 to 34) and of the distances (dp1, dp4) between each end (31 to 34) of one of these polygons (Pm, Pf) and the orthogonal projection (PP1 to PP4) of this end (31, 34), if it exists, on the other polygon (Pm, Pf).

14. The process as claimed in claim 11, characterized in that the optimal execution option is determined by optimizing the value of an execution rating NEX according to the formula NEX=f(D(Pm, Pf), NACC(Pm), NACC(Pf)), where D(Pm, Pf) is the calculated distance between the mother polygon (Pm) and the daughter polygon (Pf), NACC(Pm) and NACC(Pf) are the accessibility ratings of the mother polygon (Pm) and the daughter polygon (Pf) respectively, calculated in such a way as to be minimal for the polygons having least depth and greatest accessibility, and f is a multipolynomial function.

15. The process as claimed in claim 1, characterized in that, where the servicing operation consists in the execution of a step of cutting (17) a track, called the daughter track (10), of conductive material forming an equipotential connection, called the daughter equipotential connection of the electrical circuit, and a step of depositing a track of conductive material (18) between a track, called the mother track (20), of conductive material forming an equipotential connection, called the mother equipotential connection, of the electrical circuit and a residual portion (16a) of the daughter track (10) between the cut (17) and a first branching node (11) encountered in a specified direction downline from the cut (17), in the retrieval step, at least all the accessible polygons of each mother track (20) and daughter track (10) are retrieved, an execution rating is calculated and assigned to each execution option of the deposition step, for all the accessible polygons of the mother track (20) and the daughter track (10), an execution rating is calculated and assigned to each execution option of the cutting step, the best compromise between the cutting stage and the deposition stage is determined automatically, by determining, for each execution option of the cutting step, the optimal execution option (DEPOPT) of the deposition step corresponding to this execution option of the cutting step, where only the accessible polygons of the portion (16b) of the upline reduced branch of the daughter track (10) extending between the cut (17) and the topological branching node (11) are taken into consideration for the execution options of the deposition step.

16. A device for automatic optimal location of a servicing operation on an integrated circuit, comprising:

means (2) for holding an integrated circuit (3) comprising a plurality of physical layers forming an electrical circuit with a plurality of electrical functional elements, servicing means (4) acting on at least one surface, called the access surface (5), of an integrated circuit (3) placed on the holding means (2), these servicing means (4) being adapted to enable a specified servicing operation, comprising at least one step, to be carried out on at least one element of the electrical circuit, in a delimited area accessible from the direction of the access surface, and means, called accessible polygon retrieval means, for calculating data, on the basis of, on the one hand, topographic descriptive data identifying polygons in each layer of the circuit (3), where each polygon is formed from a characteristic material of the circuit (3), and, on the other hand, data representing the electrical circuit, in order to identify, for at least each element of the electrical circuit on which at least one step of the servicing operation is to be carried out, the different polygons, called accessible polygons, which define this element in each layer of the circuit (3), and on which the servicing means (4) can be positioned and can carry out at least one step of the servicing operation from the access surface (5), characterized in that it comprises:

means for determining, for each step of the servicing operation, different execution options for this step, corresponding respectively to each of the different accessible polygons, called the possible initial polygons, on which this step can be carried out, all the different execution options producing results which are equivalent with respect to the electrical circuit, and for calculating and assigning a rating to each execution option as a function of:

the depth of each possible initial polygon of this execution option, represented by the distance separating the layer comprising this polygon from the access surface (5), and accessibility parameters of each possible initial polygon of this execution option, means for automatically determining the optimal execution option to be used for executing each step of the servicing operation, by a numerical optimization calculation using the ratings assigned to the different execution options of each step of the servicing operation.

17. A process for automatic optimal location of a servicing operation on an integrated circuit (3) comprising a plurality of physical layers forming an electrical circuit having a plurality of electrical functional elements, this servicing operation comprising at least one step, carried out on at least one element of the electrical circuit in a delimited area accessible from the direction of one surface, called the access surface (5) of the circuit (3), wherein:

this process comprises a step, called the step of retrieving accessible polygons, in which data are calculated, on the basis of, on the one hand, topographic descriptive data identifying polygons in each layer of the circuit (3), where each polygon is formed from a characteristic material of the circuit (3), and, on the other hand, data representing the electrical circuit, in order to identify, for at least each element of the electrical circuit on which at least one step of the servicing operation is to be carried out, the different polygons, called the accessible polygons, which define this element in each layer of the circuit (3), and on which the servicing tools can be positioned and can carry out at least one step of the servicing operation from the access surface (5), according to at least one accessibility rule, for each step of the servicing operation, different options are determined for the execution of this step, corresponding to each of the different accessible polygons, called possible starting polygons, on which this step can be executed, all the different execution options producing results which are equivalent with respect to the electrical circuit, and a rating is calculated and assigned to each execution option as a function of:

the depth of each possible starting polygon of this execution option, represented by the distance separating the layer comprising this polygon from the access surface (5), and accessibility parameters of each possible starting polygon of this execution option, the optimal execution option to be used for executing each step of the servicing operation is determined automatically, by a numerical optimization calculation using the ratings assigned to the different execution options of each step of the servicing operation, said optimization calculation being adapted to facilitate the execution of the servicing operation and/or to optimize the quality of its execution and/or to minimize its total duration.

18. A process for automatic optimal location of a servicing operation on an integrated circuit (3) comprising a plurality of physical layers forming an electrical circuit having a plurality of electrical functional elements, this servicing operation comprising at least one step, carried out on at least one element of the electrical circuit in a delimited area accessible from the direction of one surface, called the access surface (5) of the circuit (3), wherein:

this process comprises a step, called the step of retrieving accessible polygons, in which data are calculated, on the basis of, on the one hand, topographic descriptive data identifying polygons in each layer of the circuit (3), where each polygon is formed from a characteristic material of the circuit (3), and, on the other hand, data representing the electrical circuit, in order to identify, for at least each element of the electrical circuit on which at least one step of the servicing operation is to be carried out, the different polygons, called the accessible polygons, which define this element in each layer of the circuit (3), and on which the servicing tools can be positioned and can carry out at least one step of the servicing operation from the access surface (5), during the retrieval step, data are calculated and generated for each element to identify at least one series of accessible polygons which have a surface, called the reduced accessible surface, corresponding to a surface which is not masked in the direction of the access surface by a higher layer of material of the same kind, and whose dimension in each direction between two higher elements is decreased by a value $\alpha i$ which depends on the depth of the layer of the polygon and on the nature of the servicing means to be used on this element, for each step of the servicing operation, different options are determined for the execution of this step, corresponding to each of the different accessible polygons, called possible starting polygons, on which this step can be executed, all the different execution options producing results which are equivalent with respect to the electrical circuit, and a rating is calculated and assigned to each execution option as a function of:

the depth of each possible starting polygon of this execution option, represented by the distance separating the layer comprising this polygon from the access surface (5), and accessibility parameters of each possible starting polygon of this execution option, the optimal execution option to be used for executing each step of the servicing operation is determined automatically, by a numerical optimization calculation using the ratings assigned to the different execution options of each step of the servicing operation.

19. The process as claimed in claim 18, characterized in that the area of the reduced accessible surface of each possible initial polygon is used as the accessibility parameter.

20. A process for automatic optimal location of a servicing operation on an integrated circuit (3) comprising a plurality of physical layers forming an electrical circuit having a plurality of electrical functional elements, this servicing operation comprising a plurality of steps, carried out on at least one element of the electrical circuit in a delimited area accessible from the direction of one surface, called the access surface (5) of the circuit (3), wherein:

this process comprises a step, called the step of retrieving accessible polygons, in which data are calculated, on the basis of, on the one hand, topographic descriptive data identifying polygons in each layer of the circuit (3), where each polygon is formed from a characteristic material of the circuit (3), and, on the other hand, data representing the electrical circuit, in order to identify, for at least each element of the electrical circuit on which at least one step of the servicing operation is to be carried out, the different polygons, called the accessible polygons, which define this element in each layer of the circuit (3), and on which the servicing tools can be positioned and can carry out at least one step of the servicing operation from the access surface (5), according to at least one accessibility rule, for each step of the servicing operation, different options are determined for the execution of this step, corresponding to each of the different accessible polygons, called possible starting polygons, on which this step can be executed, all the different execution options producing results which are equivalent with respect to the electrical circuit, and a rating is calculated and assigned to each execution option as a function of:

the depth of each possible starting polygon of this execution option, represented by the distance separating the layer comprising this polygon from the access surface (5), and accessibility parameters of each possible starting polygon of this execution option, the optimal execution option to be used for executing each step of the servicing operation is determined automatically, by a numerical optimization calculation using the ratings assigned to the different execution options of each step of the servicing operation.

\* \* \* \* \*